(12) United States Patent
Coco

(10) Patent No.: US 12,088,212 B2
(45) Date of Patent: Sep. 10, 2024

(54) POWER SUPPLY CIRCUIT, RELATED ACTUATOR AND METHOD OF SUPPLYING A LOAD

(71) Applicant: SAES GETTERS S.P.A., Lainate MI (IT)

(72) Inventor: Salvatore Coco, Cesano Maderno MB (IT)

(73) Assignee: SAES GETTERS S.P.A., Lainate MI (IT)

( * ) Notice: Subject to any disclaimer, the term of this patent is extended or adjusted under 35 U.S.C. 154(b) by 0 days.

(21) Appl. No.: 18/568,930

(22) PCT Filed: Sep. 28, 2022

(86) PCT No.: PCT/EP2022/076941
§ 371 (c)(1),
(2) Date: Dec. 11, 2023

(87) PCT Pub. No.: WO2023/052400
PCT Pub. Date: Apr. 6, 2023

(65) Prior Publication Data
US 2024/0186913 A1 Jun. 6, 2024

(30) Foreign Application Priority Data

Sep. 29, 2021 (IT) .................. 102021000024875

(51) Int. Cl.
*H02M 7/12* (2006.01)
*H02M 7/162* (2006.01)
*H02M 7/53854* (2007.01)

(52) U.S. Cl.
CPC ..... *H02M 7/1623* (2013.01); *H02M 7/53854* (2013.01)

(58) Field of Classification Search
CPC .......... H02M 7/145; H02M 1/32; H02M 7/02; H02M 7/12
See application file for complete search history.

(56) References Cited

U.S. PATENT DOCUMENTS 3,710,062 A 1/1973 Peters
2020/0321797 A1* 10/2020 Gerrits ................... B60L 53/52
(Continued)

OTHER PUBLICATIONS

Fu-Sheng Pai et al, "Cumulative current-magnetizing method for a capacitor-discharged impulse magnetizer", International Journal of Circuit Theory and Applications, 45, 2017, pp. 1439-1446.
(Continued)

*Primary Examiner* — Alex Torres-Rivera
(74) *Attorney, Agent, or Firm* — Element IP, PLC

(57) ABSTRACT

A power supply circuit for supplying a load, which may be a SMA component or a piezoelectric component, may use short high-voltage pulses to achieve fast heating of the load and, in order to comply with functional requirements, the SMA or piezoelectric component should not be supplied by connecting it directly to an electric line at a relatively high voltage. It is also disclosed an actuator comprising a power supply circuit of this disclosure and at least one load, comprising at least one smart materials chosen between a piezoelectric device and a a shape memory alloy (SMA) component, and a method of supplying a load comprising the steps of: connecting the AC to DC voltage converter of the power supply circuit to the AC mains by closing the input switch for charging a tank capacitor of the converter and, at the same time, opening the output switch for disconnecting the load from the tank capacitor: disconnecting the AC to DC voltage converter of the power supply circuit from the AC mains by opening the input switch and, at the same time, closing the output switch to supply the load by discharging the tank capacitor.

6 Claims, 5 Drawing Sheets

(56) References Cited

U.S. PATENT DOCUMENTS

| | | | |
|---|---|---|---|
| 2021/0296922 A1* | 9/2021 | Sun | H02M 1/10 |
| 2021/0296982 A1* | 9/2021 | Hafezinasab | H02M 3/1582 |
| 2023/0035838 A1* | 2/2023 | Li | H02M 1/4233 |

OTHER PUBLICATIONS

International Preliminary Report on Patentability issued Sep. 25, 2023 in PCT/EP2022/076941, 12 pages.
International Search Report issued Dec. 8, 2022 in PCT/EP2022/076941, 3 pages.
K. Yan et al, "A High-Voltage Pulse Generator for Corona Plasma Generation", IEEE Transactions on Industry Applications, vol. 38, No. 3, 2002, pp. 866-872.

* cited by examiner

POWER SUPPLY CIRCUIT, RELATED ACTUATOR AND METHOD OF SUPPLYING A LOAD

TECHNICAL FIELD

This disclosure relates in general to electric actuators and more in particular to a power supply circuit adapted to supply a shape memory alloy (SMA) component, to a related actuator comprising the power supply circuit and load comprising at least one smart materials chosen between a piezoelectric device and a a shape memory alloy (SMA) component, and a method of supplying a load.

BACKGROUND

Shape memory alloys (also referred as SMA) are materials that "remember" their original shape and return to it when heated. Thermal activation of a component made of SMA, for example a wire made of SMA, may be driven by electrical current via Joule heating, using a power supply circuit configured to force an electric current through the wire. Shape memory alloys unique property to recover shape upon heating, like the SMA wires and springs produced by SAES Getters S.p.A. under the trade name SmartFlex®, may be effectively packaged into compact, light, powerful and silent actuators to replace alternative technologies based on wax, DC motors and electrical motors. The unmatched energy density, degree of integration and simplicity in design make shape memory alloys the new industry standard for linear and rotary actuators.

In order to have a fast response of a SMA actuator, it is important to heat quickly its SMA component by using adequate power supply circuits configured to force a current throughout the SMA component.

An example of a fast SMA actuator is disclosed in the document US2016/0186730 and is schematically shown in FIG. 1. The SMA component is supplied when the output MOSFET is closed by the driving unit 31, and the current flowing therethrough is provided by a tank capacitor C1 charged by a supply unit 2. This prior SMA actuator has a simple structure, though it is specifically designed to function with a low voltage supply unit 2 that injects a controlled DC current, which is typically of 5 Ampère. The supply voltage, on its turn, is adjusted depending on the electric resistance of the SMA actuator.

SUMMARY

Controlling SMA components or piezoelectric components with this prior actuator results in a slow actuation response due to the long time required to heat up the SMA component or piezoelectric component and a great amount of heat is lost to the environment, which results in low efficiency.

According to this disclosure, a power supply circuit for supplying a load, which may be a SMA component or a piezoelectric component, may use short high-voltage pulses to achieve fast heating of the load and, in order to comply with functional requirements and avoid the component damage related to overheating and/or burning, the SMA or piezoelectric component should not be supplied by connecting it directly to an electric line at a relatively high voltage. In this regards a solution as the one described in the paper "cumulative current magnetizing method for a capacitor-discharged impulse magnetizer" by Pai et al, published in 2017 in the International Journal of circuit theory and applications, is different as it will increase the output voltage with respect to the mains input, leading to the damage of the voltage responding actuator component and it does not present any safety component able to discharge the capacitor if the load or the electrical connection is damaged.

The above requirements are met with the power supply circuit defined in claim 1.

It is also disclosed an actuator comprising a power supply circuit of this disclosure and at least one load, comprising at least one smart materials chosen between a piezoelectric component and a a shape memory alloy (SMA) component, and a method of supplying a load comprising the steps of:
connecting the AC to DC voltage converter of the power supply circuit to the AC mains by closing the input switch for charging a tank capacitor of the converter and, at the same time, opening the output switch for disconnecting the load from the tank capacitor;
disconnecting the AC to DC voltage converter of the power supply circuit from the AC mains by opening the input switch and, at the same time, closing the output switch to supply the load by discharging the tank capacitor.

Preferred embodiments are defined in the annexed claims.

DESCRIPTION OF EXEMPLARY EMBODIMENTS

Figure 1:
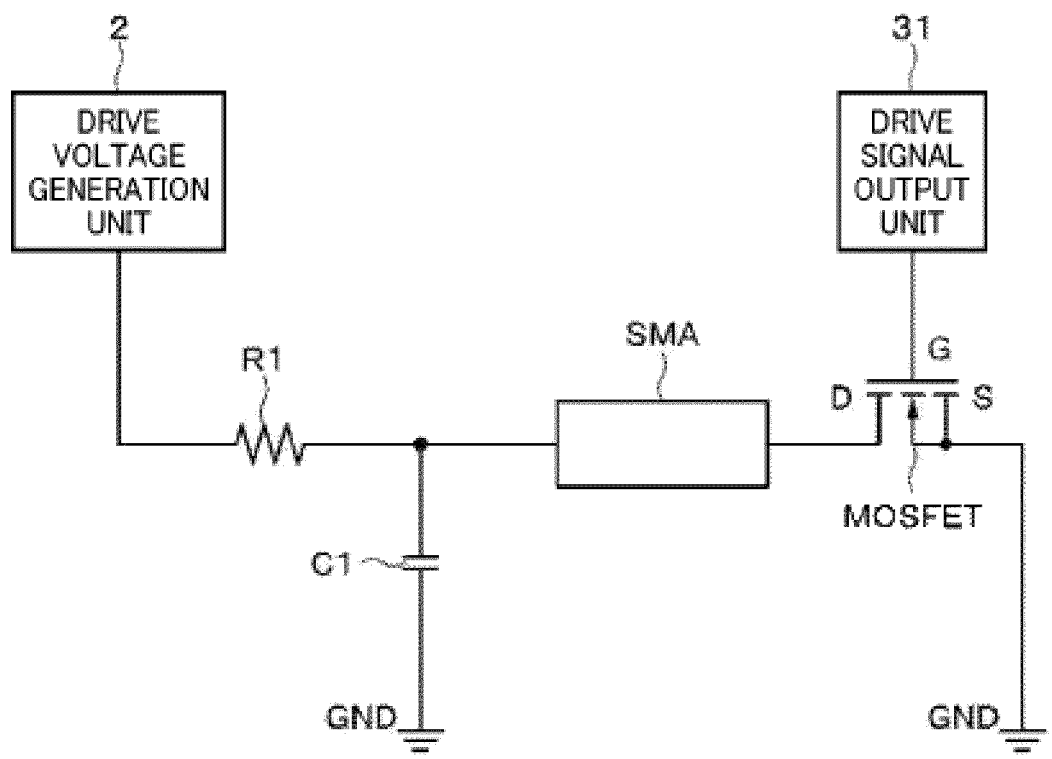
FIG. 1 depicts a prior SMA actuator operating at a DC low voltage.
Figure 2A:
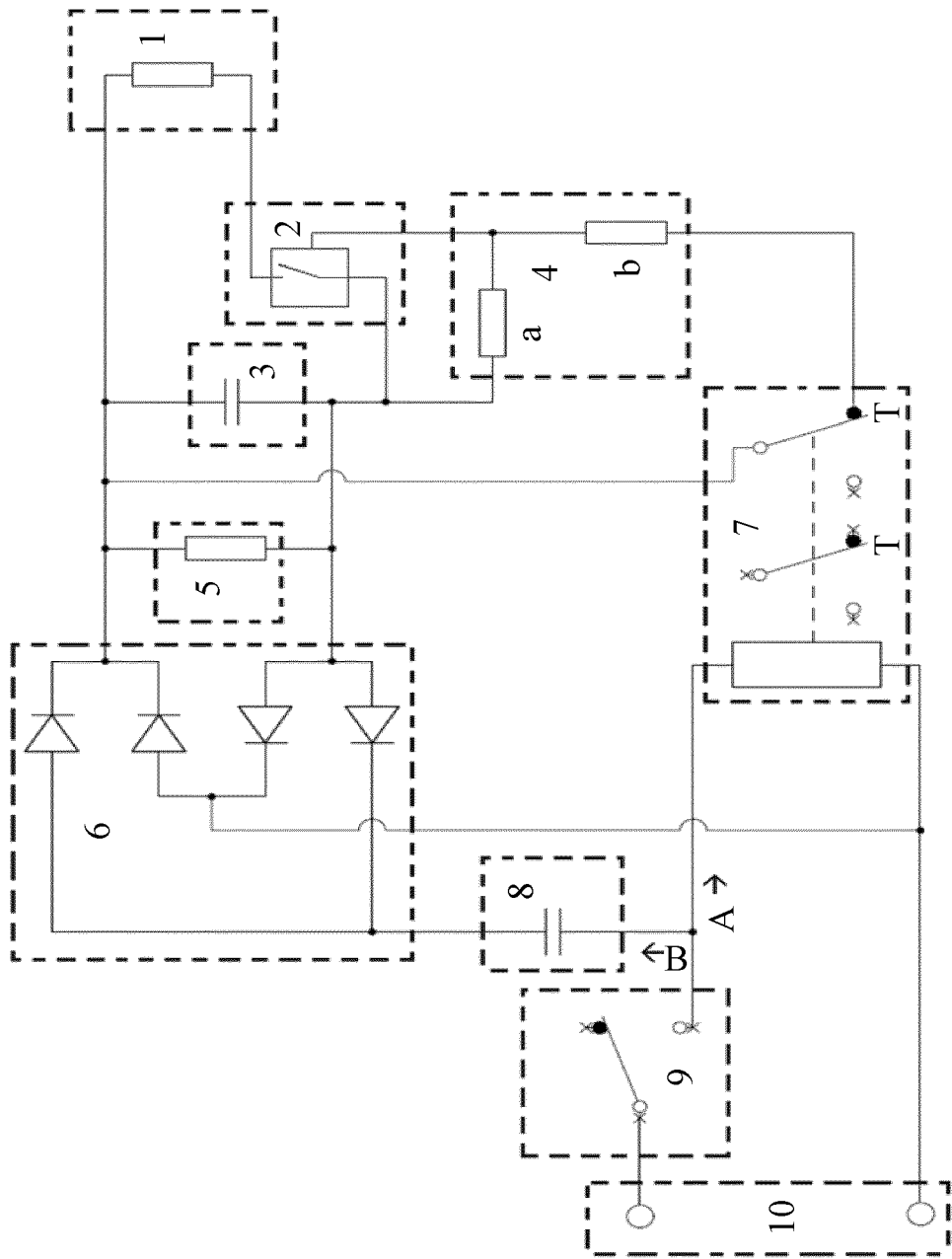
FIG. 2a depicts an embodiment of a SMA actuator according to the present disclosure having a single input switch.
Figure 2B:
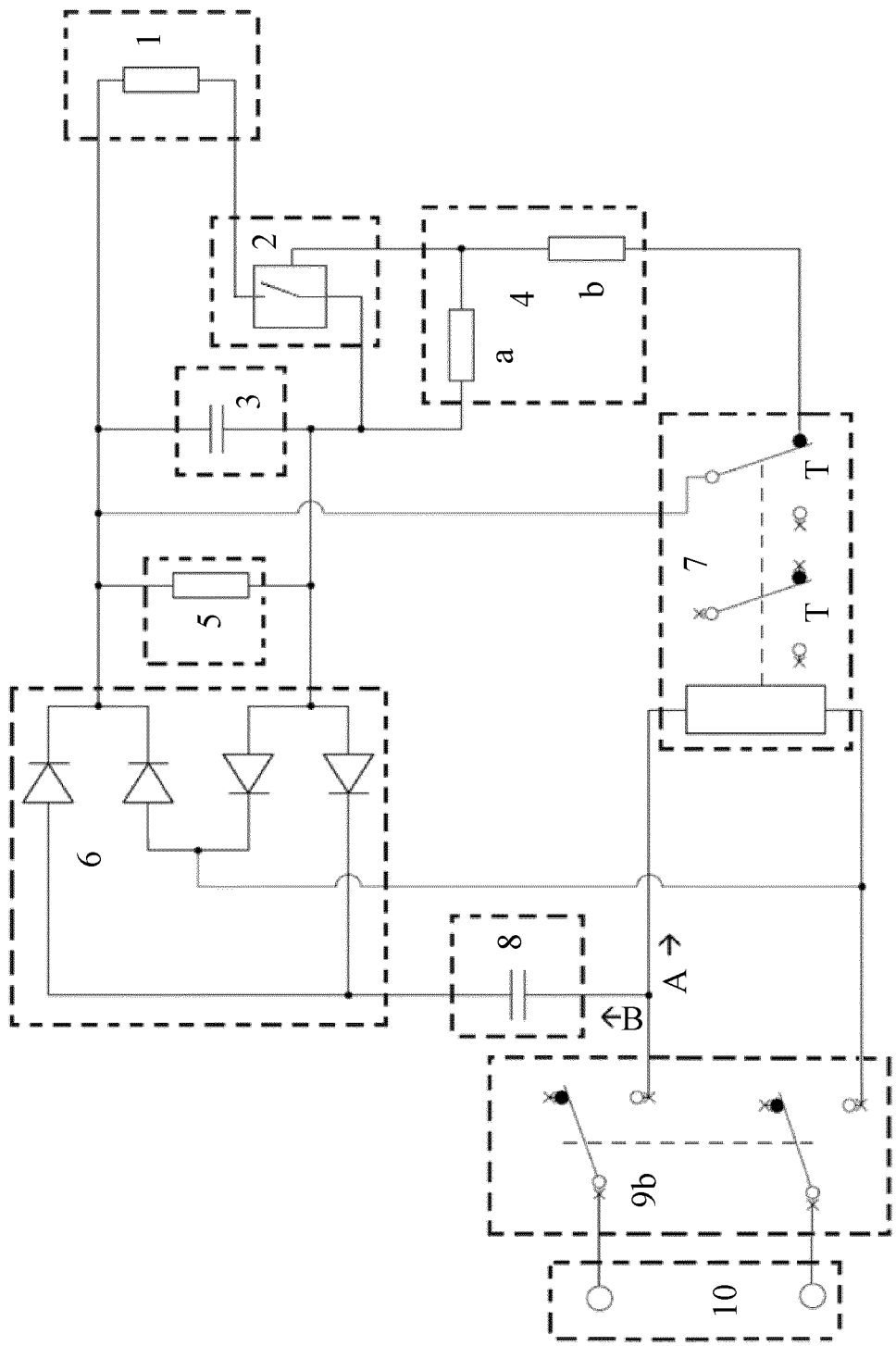
FIG. 2b depicts another embodiment of a SMA actuator according to the present disclosure having two input switches.

Exemplary embodiments of a power supply circuit adapted to supply a load using short high-voltage pulses and without directly connecting the load to an electric line at a relatively high voltage when being supplied, are shown in FIGS. 2a and 2b.

The power supply circuit comprises to main current paths, labelled with the letters A and B, departing from AC input terminals of the power supply circuit and leading to DC output terminals to which a supplied load 1 and the output switch 2 are connected. In the electric path B there is an AC to DC voltage converter 3, 5, 6, 8, connected between the AC input terminals and the DC output terminals, wherein the AC to DC voltage converter 3, 5, 6, 8, is configured to receive an AC mains voltage on the AC input terminals to generate a corresponding rectified DC voltage on the DC output terminals, wherein the AC to DC voltage converter 3, 5, 6, 8, comprises a tank capacitor 3 functionally connected between the DC output terminals to hold the rectified DC voltage.

As a general rule, the AC to DC voltage converter may be of any type. According to an optional aspect, depicted in FIGS. 2a and 2b, the AC to DC voltage converter may comprise a full-wave diode bridge rectifier 6, functionally connected between the AC input terminals and the DC output terminals to generate the rectified DC voltage as a rectified replica of the AC mains voltage, made available to a supplied load 1. According to an aspect, the tank capacitor 3 has a capacitance value comprised between 10 µF and 470 µF.

According to an optional aspect, depicted in FIGS. 2a and 2b, the AC to DC voltage converter may even comprise an input capacitor 8 functionally connected between the full-wave diode bridge rectifier 6 and an AC input terminal in order to limit an AC current absorbed by the full-wave diode bridge rectifier 6. According to an aspect, the input capacitor 8 may have a capacitance value comprised between 0.1 µF and 47 µF.

An auxiliary resistor 5 is connected electrically in parallel with the tank capacitor 3 to discharge the tank capacitor 3 when the load cannot be supplied because it is out of order or its electrical connection is damaged. The auxiliary resistor 4 may have a suitable resistance value so as not to discharge significantly the tank capacitor 3 when the electrical connections to the load 1 and the load 1 itself are working, but to discharge safely the tank capacitor 3 in case of failure of the load 1. According to an aspect, the auxiliary resistor 5 has a resistance value comprised between 150-500 KΩ.

In the other current path A, there is a switching relay 7 having an excitation coil connected between the AC input terminals and configured to be powered every time an AC voltage is applied to the AC input terminals, from which the electric paths A and B depart, and having at least one internal switch controlled by the excitation coil and configured to connect an intermediate terminal T of the power supply circuit to one of the two DC output terminals of when the excitation coil is not powered.

The two current paths A and B are either both supplied at the same time or both disconnected by an input switch 9 configured to connect/disconnect at least one of the AC input terminals to the AC mains. When the input switch 9 is closed, the AC to DC converter is energized and so the tank capacitor 3 is charged with a rectified DC voltage, and at the same time the excitation coil of the switching relay 7 attracts the switch of the relay 7 so as to keep the intermediate terminal T disconnected. When the input switch 9 is open, then the AC to DC converter is not energized and so the tank capacitor 3 is disconnected from the mains terminals 10 and the switch of the relay 7 is released.

The power supply circuit comprises also at least one driving unit 4 directly connected between one of the DC output terminals and a respective intermediate terminal T of the power supply circuit. The driving unit 4 is configured to generate a control signal which is logically active when the at least one respective intermediate terminal T is not disconnected, and this control signal is provided to a control terminal of a respective at least one output switch 2 configured to be turned on when the control signal is logically active. In practice, when the input switch 9 is open, the AC to DC converter is disconnected from the AC mains terminals 10 and, at the same time, the switch of the relay 7 connects the intermediate terminal T in a current path between the two DC output terminals of the power supply circuit. In this configuration, the driving unit 4 generates a logically active control signal and the output switch 2 connects the respective load 1 so as to be supplied through the DC output terminals, allowing the electric charge stored in the tank capacitor 3 to flow throughout the load 1.

Figure 3:
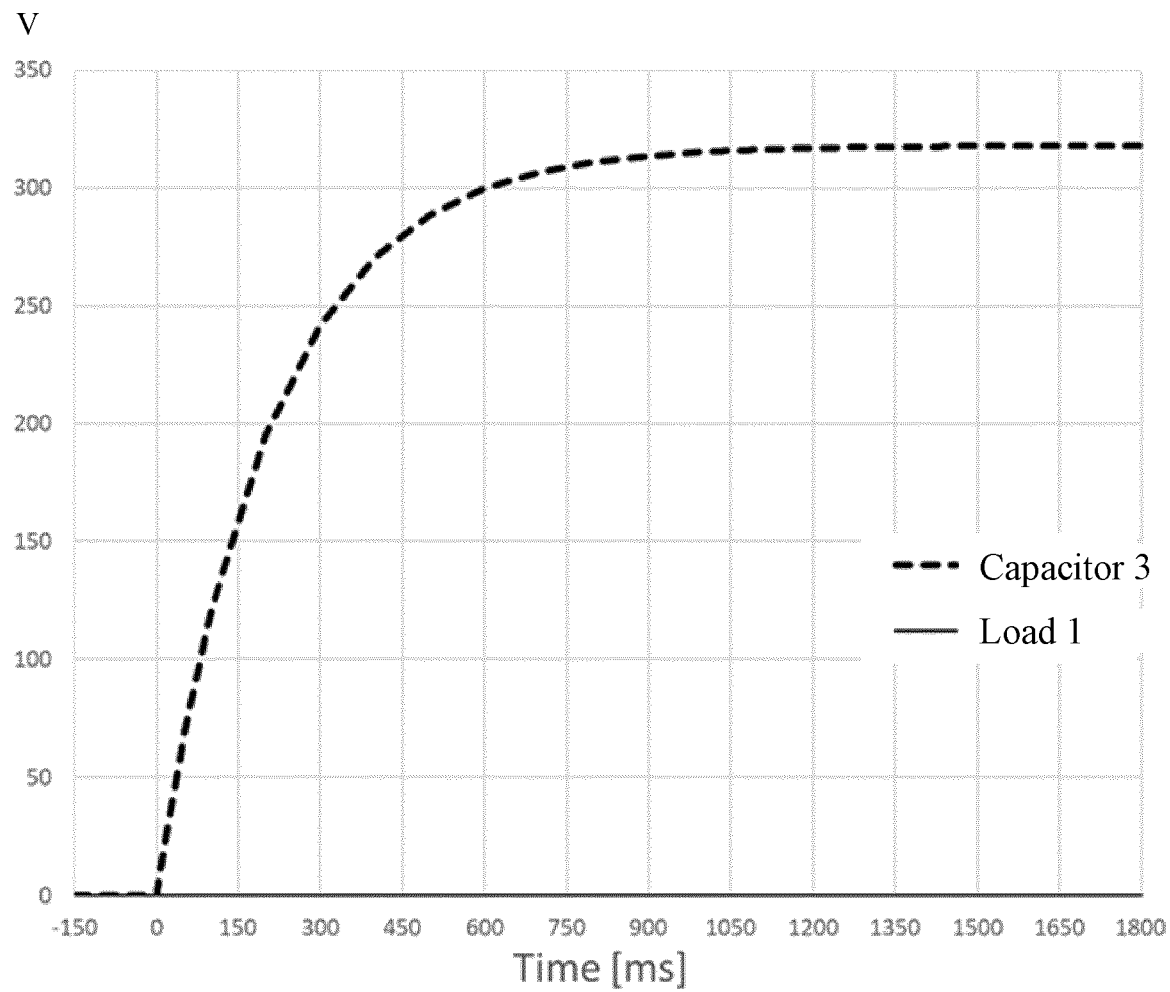
FIG. 3 is an exemplary time graph of the voltage on the tank capacitor during a charging phase.
Figure 4:
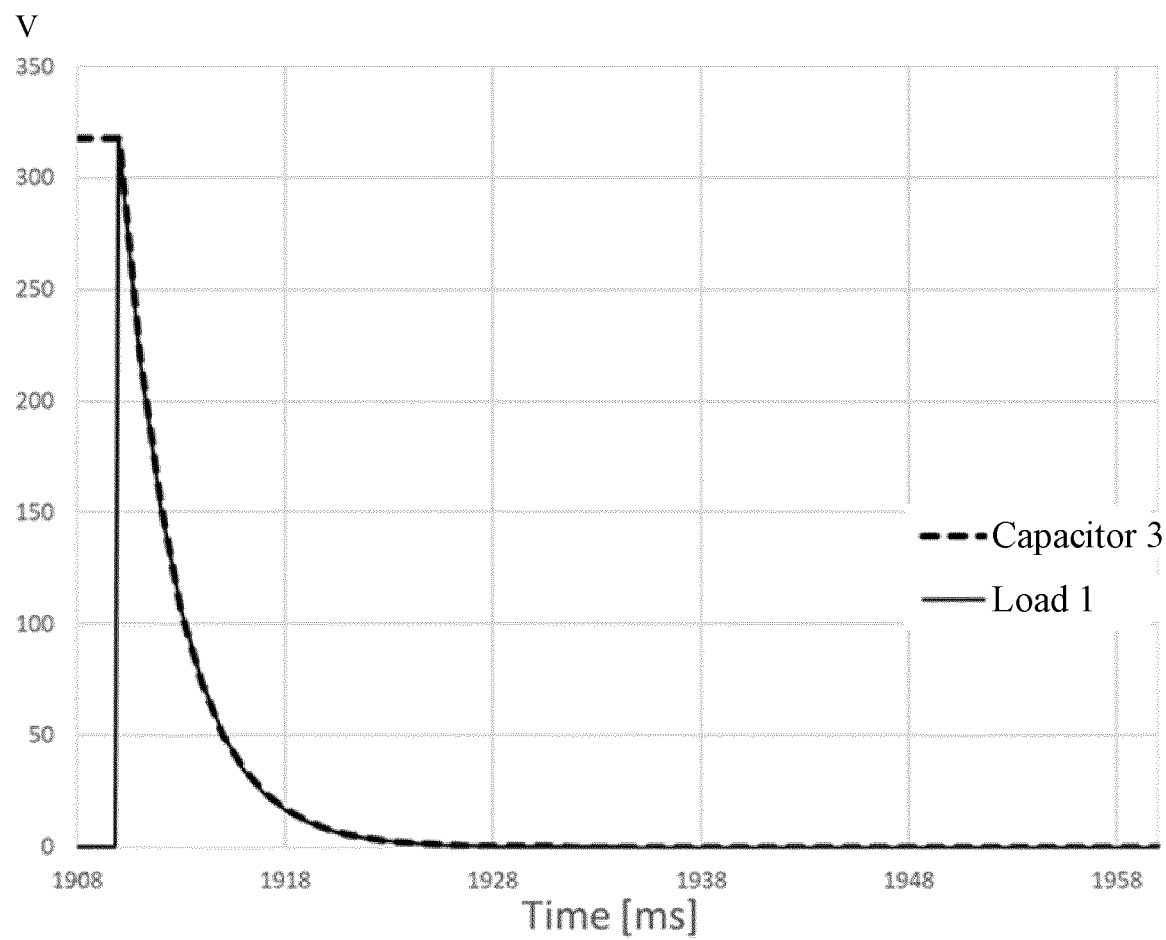
FIG. 4 is an exemplary time graph of the voltage on the tank capacitor during a discharging phase and of the corresponding voltage pulse delivered to the supplied load.

When the input switch 9 is closed, the tank capacitor 3 is charged by the AC mains voltage, for example with a time profile as shown by way of example in FIG. 3. During this charging phase, the load 1 is disconnected from the tank capacitor 3 and thus it is disconnected from the AC mains terminals 10. When the input switch 9 is open, the tank capacitor 3 is disconnected by the AC mains terminals 10 and the output switch 2 connects the load 1 to the DC output terminals, thus the load 1 is supplied with a voltage pulse, as shown merely for example in the time diagram of FIG. 4. Therefore, using the power supply circuit defined in claim 1, the load 1 is supplied with discharge pulses starting from a relatively high voltage but the load 1 is never directly connected to the AC mains terminals 10, thus it is easy to meet safety requirements about electric loads 1 which cannot be powered by direct connection to relatively high voltage lines.

According to an aspect, the terminals 10 of the AC mains are at a voltage comprised between 220-240 V AC.

In general, the driving unit 4 may be any circuit block capable of generating a logically active control signal when the respective intermediate terminal T is not disconnected. According to an optional aspect, depicted in FIGS. 2a and 2b, the at least one driving unit 4 is a resistive voltage divider directly connected between a DC output terminal and the respective intermediate terminal T, wherein the control signal is a voltage made available at a middle terminal of the resistive voltage divider. Merely as an example, the resistive voltage divider 4 comprises a first resistance 4a, sharing a connection node with the output switch 2, with a value comprised between 5-10 KΩ and a second resistance 4b, directly connected to the intermediate node T, with a value comprised 400-450 KΩ. According to an optional aspect, the driving unit 4, and as an example the resistive voltage divider 4 depicted in FIGS. 2a and 2b, is connected from one side to the negative DC output terminal of the tank capacitor 3 and from the other side to the intermediate terminal T.

The output switch 2 may be any controlled switch closed when the control signal is active and open when the control signal is logically inactive. Merely as an example, the at least one output switch 2 may be a thyristor functionally connected to be turned on when the control signal is logically active.

The power supply circuits of this disclosure may be configured to supply a plurality of loads 1, by providing a plurality of driving units 4 directly connected between a DC output terminal and the respective plurality of intermediate terminals T, wherein the plurality of driving units 4 are all configured to generate a respective plurality of control signals which are all logically active when the respective intermediate terminal T is not disconnected; by providing a plurality of output switches 2 configured to be turned on when the respective plurality of control signals are logically active, and configured to connect a respective plurality of loads 1 to be supplied by said DC output terminals; and by providing a switching relay 7 comprising a plurality of internal switches all controlled by the same excitation coil and configured to connect the plurality of intermediate terminals T to a DC output terminal when the excitation coil is not powered.

The power supply circuits of this disclosure may be used to realize actuators for powering one or more loads 1, wherein the load 1 comprises at least one smart material chosen between a piezoelectric device and a shape memory alloy (SMA) component.

According to an aspect, the load 1 includes at least one SMA wire, which can be made of Ni—Ti alloy, for example of the type comprising one or more element chosen among Hf, Pt, Cu, Nb.

According to an aspect, the SMA wire has a diameter comprised between 76-350 μm. Using a power supply circuit of this disclosure, it is possible to realize an actuator suitable for activating piezoelectric components or SMA components, in a time interval comprised between 1-100 ms, preferably between 5-25 ms.

The invention claimed is:

1. A power supply circuit, comprising:
   an AC to DC voltage converter, having AC input terminals and DC output terminals, wherein said AC to DC voltage converter is configured to receive an AC mains voltage on said AC input terminals to generate a corresponding rectified DC voltage on said DC output terminals, wherein said AC to DC voltage converter comprises a tank capacitor functionally connected between said DC output terminals to hold said rectified DC voltage and an input capacitor functionally connected between a full-wave diode bridge rectifier and an AC input terminal of said AC input terminals in order to limit an AC current absorbed by said full-wave diode bridge rectifier and a resistor connected electrically in parallel with the tank capacitor to discharge the tank capacitor when a load cannot be supplied because it is out of order or its electrical connection is damaged;
   at least an input switch configured to connect/disconnect at least one AC input terminal of said AC input terminals to AC mains;
   at least one driving unit directly connected between a first DC output terminal of said DC output terminals and at least one respective intermediate terminal of the power supply circuit, said at least one driving unit being configured to generate a control signal which is logically active when said at least one respective intermediate terminal is not disconnected;
   at least one output switch configured to be turned on when said control signal is logically active, and configured to connect a respective at least one load to be supplied by said DC output terminals allowing electric charge stored in the tank capacitor to flow throughout the load;
   a switching relay having an excitation coil connected between said AC input terminals and configured to be powered every time an AC voltage is applied to said AC input terminals, and having at least one internal switch controlled by said excitation coil and configured to connect said at least one respective intermediate terminal to a second DC output terminal of said DC output terminals when said excitation coil is not powered;
   wherein said at least one driving unit is a resistive voltage divider directly connected between said first DC output terminal and said at least one respective intermediate terminal, wherein said control signal is made available at a middle terminal of the resistive voltage divider.

2. The power supply circuit of claim 1, wherein said full-wave diode bridge rectifier is functionally connected between said AC input terminals and said DC output terminals to generate said rectified DC voltage as a rectified replica of said AC mains voltage.

3. The power supply circuit of claim 1, wherein said at least one output switch is a thyristor functionally connected to be turned on when said control signal is logically active.

4. The power supply circuit of claim 1, comprising:
   a plurality of driving units directly connected between the first DC output terminal and said respective plurality of intermediate terminals, said plurality of driving units being configured to generate a respective plurality of control signals which are all logically active when said respective plurality of intermediate terminals are not disconnected,
   a plurality of output switches configured to be turned on when said respective plurality of control signals are logically active, and configured to connect a respective plurality of loads to be supplied by said DC output terminals;
   wherein said switching relay comprises a plurality of internal switches all controlled by said excitation coil and configured to connect said respective plurality of intermediate terminals to said second DC output terminal when said excitation coil is not powered.

5. An actuator, comprising:
   the power supply circuit of claim 1, and
   at least one load, comprising at least one smart material chosen between a piezoelectric device and a a shape memory alloy component.

6. A method of supplying a load from AC mains, comprising:
   installing a power supply circuit according to claim 1;
   connecting the load to the output switch of said power supply circuit;
   connecting the AC to DC voltage converter of the power supply circuit to said AC mains by closing the input switch charging the tank capacitor functionally connected between the DC output terminals of the power supply circuit and, at the same time, opening the output switch for disconnecting the load from the tank capacitor;
   disconnecting the AC to DC voltage converter of the power supply circuit from the AC mains by opening the input switch and, at the same time, closing the output switch to supply the load by discharging the tank capacitor.

* * * * *